(12) United States Patent
Guo et al.

(10) Patent No.: US 12,597,904 B2
(45) Date of Patent: Apr. 7, 2026

(54) SINGLE ANTENNA INDUCTOR TO MATCH ALL BANDS IN A FRONT-END MODULE

(71) Applicant: SKYWORKS SOLUTIONS, INC., Irvine, CA (US)

(72) Inventors: Jiunn-Sheng Guo, Eastvale, CA (US); Joji Fujiwara, Suita (JP); Nobuyuki Tsujimoto, Osaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 636 days.

(21) Appl. No.: 17/659,340

(22) Filed: Apr. 15, 2022

(65) Prior Publication Data

US 2022/0345103 A1      Oct. 27, 2022

Related U.S. Application Data

(60) Provisional application No. 63/178,004, filed on Apr. 22, 2021.

(51) Int. Cl.
| | |
|---|---|
| *H03H 7/38* | (2006.01) |
| *H01Q 1/22* | (2006.01) |
| *H04B 1/04* | (2006.01) |
| *H04B 1/18* | (2006.01) |

(52) U.S. Cl.
CPC ................ *H03H 7/38* (2013.01); *H01Q 1/22* (2013.01); *H04B 1/0458* (2013.01); *H04B 1/18* (2013.01); *H03H 2007/386* (2013.01)

(58) Field of Classification Search
CPC ...... H03H 7/38; H03H 2007/386; H01Q 1/22; H04B 1/0458; H04B 1/18
See application file for complete search history.

(56) References Cited

U.S. PATENT DOCUMENTS

| | | | |
|---|---|---|---|
| 2004/0127178 A1* | 7/2004 | Kuffner | H01P 1/20 |
| | | | 455/133 |
| 2007/0173210 A1* | 7/2007 | Cho | H04B 1/52 |
| | | | 455/78 |
| 2015/0133067 A1* | 5/2015 | Chang | H04B 1/006 |
| | | | 455/78 |
| 2017/0063412 A1* | 3/2017 | Ripley | H04B 1/18 |
| 2018/0076834 A1* | 3/2018 | Wloczysiak | H04L 5/0098 |
| 2021/0320683 A1* | 10/2021 | Seong | H04B 1/0458 |

* cited by examiner

*Primary Examiner* — Andrea Lindgren Baltzell
*Assistant Examiner* — Kimberly E Glenn
(74) *Attorney, Agent, or Firm* — Lando & Anastasi, LLP

(57) ABSTRACT

A switching module assembly is provided. The switching module assembly includes a plurality of transmit/receive terminals, an antenna terminal, a shunt indictor coupled to the antenna terminal, a plurality of duplexers coupled to the plurality of transmit/receive terminals, and a plurality of impedance rotation elements coupled to the plurality of duplexers. Each duplexer corresponds to a signal frequency of a plurality of signal frequencies, and the impedance rotation elements are configured to adjust the impedance of each duplexer in conjunction with the shunt inductor to provide a resonant frequency at the signal frequency of each duplexer. The switching module can be used in the front-end module of a communications device, such as a mobile phone.

18 Claims, 5 Drawing Sheets

SINGLE ANTENNA INDUCTOR TO MATCH ALL BANDS IN A FRONT-END MODULE

CROSS REFERENCE TO RELATED APPLICATIONS

This application claims priority under 35 U.S.C. § 119(e) to U.S. Provisional Patent Application Ser. No. 63/178,004 titled SINGLE ANTENNA INDUCTOR TO MATCH ALL BANDS IN A FRONT-END MODULE, filed Apr. 22, 2021, which is incorporated herein by reference for all purposes.

BACKGROUND

1. Technical Field

The present disclosure relates generally to front-end modules (FEM). More particularly, aspects of the present disclosure relate to systems and methods for improving impedance matching in FEM architectures.

SUMMARY

According to an aspect of the present disclosure, a switching module assembly is provided. The switching module assembly includes a plurality of transmit/receive terminals, an antenna terminal, at least one shunt indictor coupled to the antenna terminal, a plurality of duplexers coupled to the plurality of transmit/receive terminals, and a plurality of phase/impedance rotation elements coupled to the plurality of duplexers. Each duplexer corresponds to a signal frequency of a plurality of different signal frequencies, and the phase/impedance rotation elements are configured to adjust the impedance of each duplexer in conjunction with the at least one shunt inductor to provide a resonant frequency at the signal frequency of each duplexer.

According to some embodiments, the switching module may be configured to selectively connect each transmit/receive terminal of the plurality of transmit/receive terminals to the antenna terminal.

According to some embodiments, the switching module may be configured to receive radio frequency signals at each of the plurality of transmit/receive terminals and the antenna terminal.

According to some embodiments, the antenna terminal of the switching module may be configured to be connected to an antenna.

According to some embodiments, each duplexer of the plurality of duplexers may be configured to be coupled to a receive path and a transmit path.

According to some embodiments, each duplexer of the plurality of duplexers may be coupled to a corresponding phase/impedance rotation element of the plurality of phase/impedance rotation elements.

According to some embodiments, each duplexer of the plurality of duplexers may include a receive portion and a transmit portion.

According to some embodiments, each transmit and receive portion of each duplexer of the plurality of duplexers may be coupled to a different phase/impedance rotation element of the plurality of phase/impedance rotation elements.

According to some embodiments, each phase/impedance rotation element may be configured to provide a first portion of an impedance match and the at least one shunt inductor may be configured to provide a second portion of the impedance match.

According to some embodiments, the plurality of duplexers may be coupled to the plurality of transmit/receive terminals via a plurality of electric traces.

According to some embodiments, each phase/impedance rotation element of the plurality of phase/impedance rotation elements may be configured to provide a first portion of an impedance match, each electrical trace of the plurality of electrical traces may be configured to provide a second portion of the impedance match, and the at least one shunt inductor may be configured to provide a third portion of the impedance match.

According to some embodiments, each phase/impedance rotation element of the plurality of phase/impedance rotation elements may include at least one capacitor.

According to some embodiments, the switching module assembly may be configured to be included in a front-end module.

According to some aspects of the present disclosure, a signal switching system is provided. The signal switching system includes a switching module assembly including a plurality of transmit/receive terminals and an antenna terminal, at least one shunt inductor coupled to the antenna terminal and configured to provide a first portion of an impedance match, and a plurality of duplexers coupled to the plurality of transmit/receive terminals, each duplexer corresponding to a respective signal frequency of a plurality of different signal and including at least one phase/impedance rotation element to provide a second portion of the impedance match, each duplexer being configured to selectively couple with the switching module assembly based on the impedance match.

According to some embodiments, the signal switching system may also include a plurality of electrical traces, each respective electrical trace connecting a respective duplexer of the plurality of duplexers to a respective transmit/receive terminal of the plurality of transmit receive terminals, each respective electrical trace providing a third portion of the impedance match.

According to some embodiments, the duplexers of the signal switching system may be configured to be coupled to a transmit path and a receive path, and each duplexer may have a transmit portion and a receive portion.

According to some embodiments, each transmit portion of each duplexer of the plurality of duplexers may be coupled to a respective phase/impedance rotation element, and each receive portion of each duplexer of the plurality of duplexers may be coupled to a different respective phase/impedance rotation element.

According to some embodiments, each respective phase/impedance rotation element may be coupled to a respective electrical trace of the plurality of electrical traces.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and examples are directed to front end modules and components thereof, and to devices, modules, and systems incorporating same.

It is to be appreciated that aspects of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
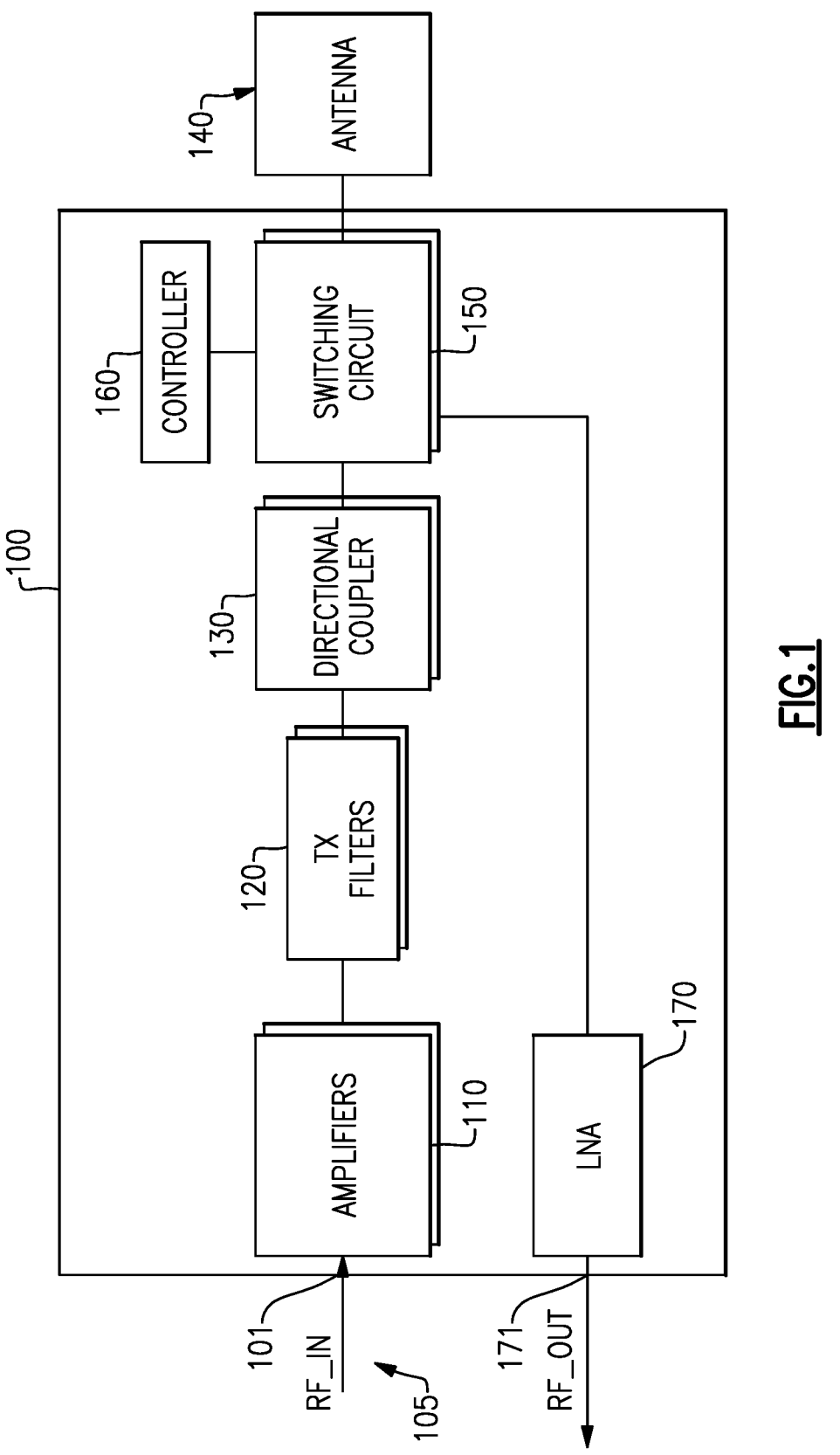
FIG. 1 is a block diagram of a front-end module.

FIG. 1 is a block diagram illustrating an example of a typical arrangement of a radio-frequency (RF) "front-end" sub-system or module (FEM) 100 as may be used in a communications device, such as a mobile phone, for example, to transmit and receive RF signals. The FEM 100 shown in FIG. 1 includes a transmit path (TX) configured to provide signals to an antenna for transmission and a receive path (RX) to receive signals from the antenna. In the transmit path (TX), a power-amplifier module 110 provides gain to an RF signal 105 received by the FEM 100 via an input port 101, producing an amplified RF signal. The power amplifier module 110 can include one or more power amplifiers (PAs), or "amplifiers."

The FEM 100 can further include a filtering sub-subsystem or module 120, which can include one or more filters. In some examples, a directional coupler 130 can be used to extract a portion of the power from the RF signal traveling between the power-amplifier module 110 and an antenna 140 connected to the FEM 100. The antenna 140 can transmit the RF signal and can also receive RF signals. A switching circuit 150, also referred to as an antenna switch module (ASM), can be used to switch between a transmitting mode and receiving mode of the FEM 100, for example, or between different transmit or receive frequency bands. In certain examples, the switching circuit 150 can be operated under the control of a controller 160.

The FEM 100 can also include a receive path (RX) configured to process signals received by the antenna 140 and provide the received signals to a signal processor (e.g., a transceiver) via an output port 171. The receive path (RX) can include one or more low-noise amplifiers (LNA) 170 to amplify the signals received from the antenna 140. Although not shown, the receive path (RX) can also include one or more filters for filtering the received signals.

As described above, antenna switching modules (e.g., switching circuit 150) can be used in front end module (FEM) products, such as radio transceivers, wireless handsets, and the like. In one example, the ASM is configured to connect the antenna to either the transmit path (TX) or the receive path (RX) depending on the mode of operation. In some examples, the ASM may be coupled to multiple duplexers for multi-band applications.

Figure 2:
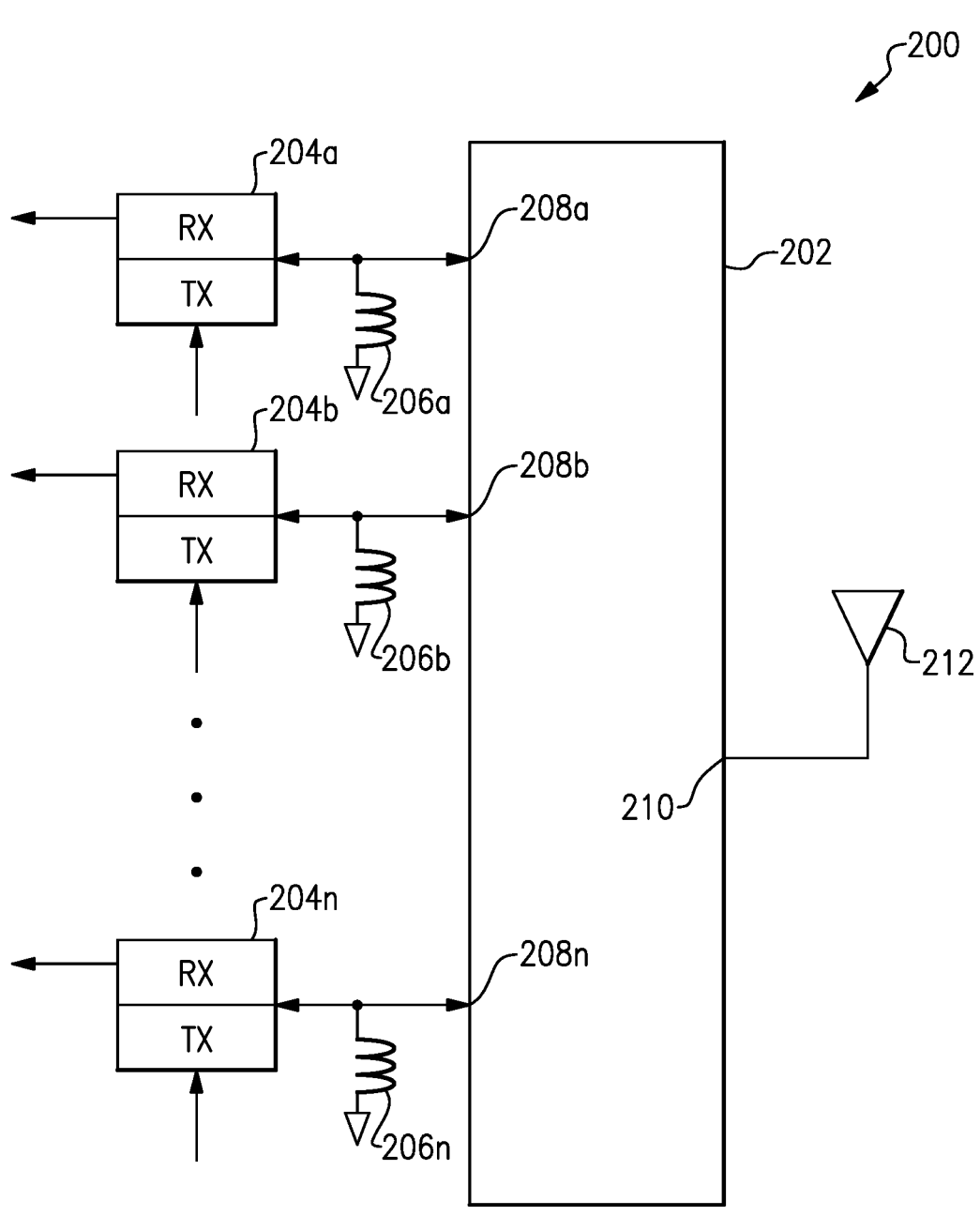
FIG. 2 is a block diagram of an antenna switching module arrangement.

FIG. 2 is a schematic diagram of an ASM arrangement 200. In one example, the ASM arrangement 200 may be included in a FEM (e.g., the FEM 100 of FIG. 1). The ASM arrangement 200 includes an ASM 202, a plurality of duplexers 204, and a plurality of shunt inductors 206. As shown, the ASM 202 includes a plurality of transmit/receive (T/R) terminals 208 coupled to the plurality of duplexers 204. For example, the first input 208a is coupled to the first duplexer 204a, the second input 208b is coupled to the second duplexer 204b, and so on. In some examples, the ASM 202 includes an antenna terminal 210 coupled to an antenna 212. In this context, the term "terminal" may be used interchangeably with "port" or "pin".

In one example, each of the plurality of duplexers 204 is coupled to a pair of receive (RX) and transmit (TX) paths. Each duplexer of the plurality of duplexers 204 may include switching, coupling, and/or filtering circuitry configured to direct radio frequency (RF) signals to/from the respective receive (RX) and transmit (TX) paths. In some examples, the ASM 202 can be operated or controlled in different modes of operation to connect each of the plurality of duplexers 204 to the antenna 212 (via the antenna terminal 210). For example, in a first mode of operation, the ASM 202 can be controlled to connect the first duplexer 204a to the antenna 212 by coupling the first T/R terminal 208a to the antenna terminal 210. As such, during the first mode of operation, RF signals received by the antenna 212 are provided to the receive (RX) path coupled to the first duplexer 204a. Likewise, during the first mode of operation, RF signals provided by the transmit (TX) path coupled to the first duplexer 204a can be transmitted by the antenna 212. Similarly, in a second mode of operation, the ASM 202 can be controlled to connect the second duplexer 204b to the antenna 212 by coupling the second T/R terminal 208b to the antenna terminal 210, and so on.

In some examples, each duplexer of the plurality of duplexers 204 corresponds to a specific frequency or frequency band. For example, the first duplexer 204a and the receive (RX) and transmit (TX) paths coupled to the first duplexer 204a may correspond to a first frequency or frequency band. As such, the ASM 202 can be controlled to operate in the first mode of operation when transmitting/receiving RF signals corresponding to the first frequency (or frequency band). Likewise, the second duplexer 204b and the receive (RX) and transmit (TX) paths coupled to the second duplexer 204b may correspond to a second frequency or frequency band and the ASM 202 can be controlled to operate in the second mode of operation when transmitting/receiving RF signals corresponding to the second frequency (or frequency band), and so on.

In order to provide optimal performance (e.g., low loss) at each frequency (or frequency band), the resonant frequency of each duplexer (and the respective RX, TX paths) may be tuned or adjusted via impedance matching. In one example, the plurality of shunt inductors 206 are coupled between the plurality of duplexers 204 and the plurality of inputs 208 to provide an impedance match during each mode of operation. For example, the first shunt inductor 206a is configured to adjust the impedance of the first duplexer 204a and the receive (RX) and transmit (TX) paths coupled to the first duplexer 204a to provide a resonant frequency at the first frequency (or frequency band) during the first mode of operation. Likewise, the second shunt inductor 206b is configured to adjust the impedance of the second duplexer 204b and the receive (RX) and transmit (TX) paths coupled to the second duplexer 204b to provide a resonant frequency at the second frequency (or band) during the second mode of operation, and so on.

Due to the difference between each frequency (or frequency band), the plurality of shunt inductors 206 may have different values. For example, the first shunt inductor 206a may have a first value corresponding to the first frequency (or frequency band), the second shunt inductor 206b may have a second value corresponding to the second frequency (or frequency band), and so on. As such, a separate shunt inductor may be included for each duplexer/input pair, increasing the cost and footprint size of the ASM arrangement 200. In some cases, due to the increased footprint size, it can be difficult to integrate the ASM arrangement 200 into already crowded FEM designs/architectures. In certain cases, the increased footprint of the ASM arrangement 200 may increase the overall package size of the FEM.

As such, an improved ASM arrangement is provided herein. In at least one embodiment, the ASM arrangement includes a single shunt inductor and is configured to support a plurality of frequencies (or frequency bands). In some examples, the ASM arrangement includes a plurality of phase or impedance rotation elements that combine in conjunction with the single shunt inductor to provide optimal performance at each of the plurality of frequencies (or frequency bands).

Figure 3:
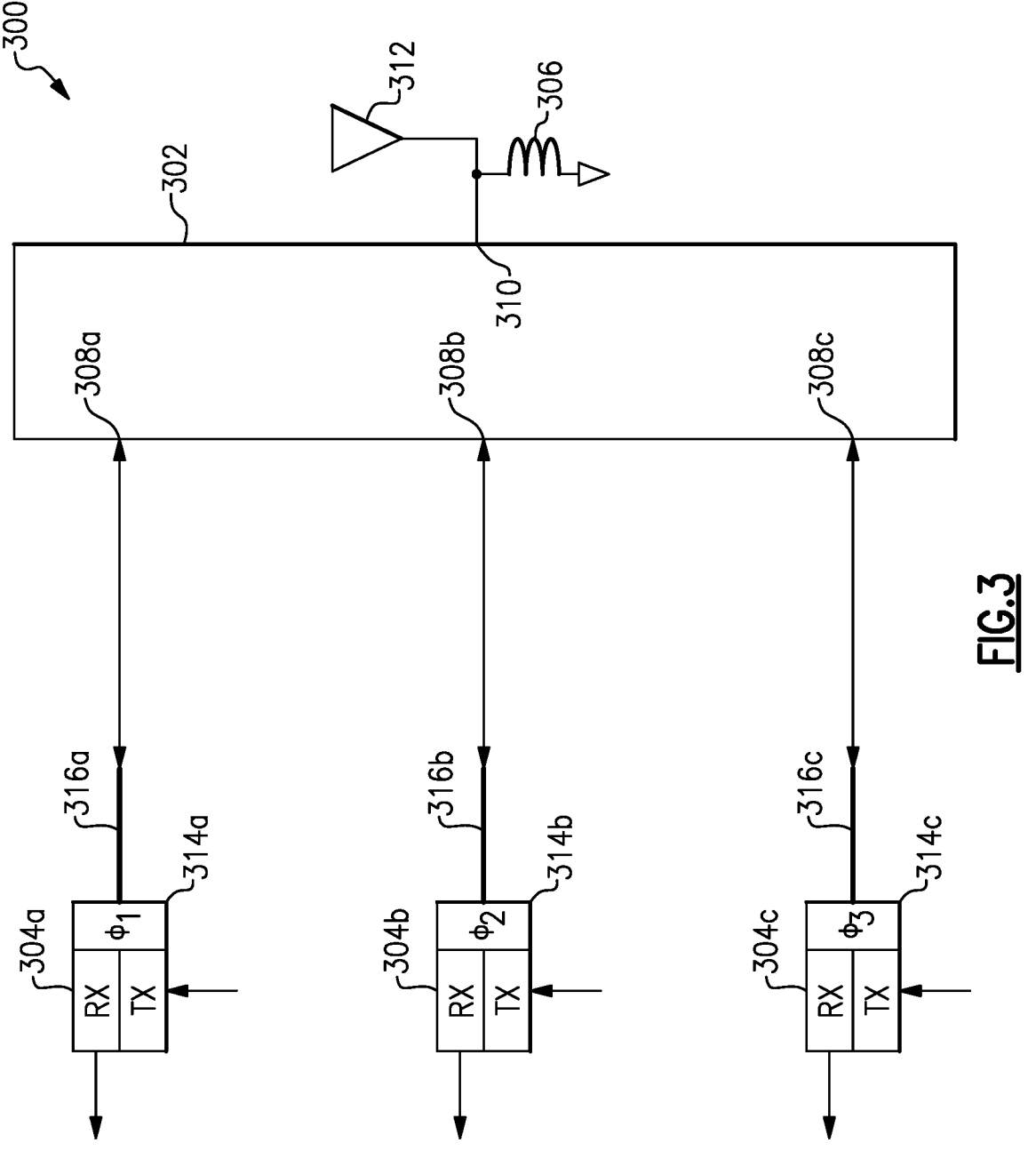
FIG. 3 is a block diagram of an antenna switching module arrangement in accordance with aspects described herein.

FIG. 3 is a schematic diagram of an ASM arrangement 300 in accordance with aspects described herein. In one example, the ASM arrangement 300 may be included in a FEM (e.g., the FEM 100 of FIG. 1). The ASM arrangement 300 includes an ASM 302, a plurality of duplexers 304, and a single shunt inductor 306. As shown, a plurality of T/R terminals 308 includes a first T/R terminal 308a, a second T/R terminal 308b, and a third T/R terminal 308c; however, in other examples, the ASM 302 may include a different number of T/R terminals. The first T/R terminal 308a is coupled to the first duplexer 304a, the second T/R terminal 308b is coupled to the second duplexer 304b, and the third T/R terminal 308c is coupled to the third duplexer 304c. In some examples, the ASM 302 includes an antenna terminal 310 coupled to an antenna 312. As shown, the shunt inductor 306 is coupled to the antenna terminal 310.

In one example, each of the plurality of duplexers 304 is coupled to a pair of receive (RX) and transmit (TX) paths. Each duplexer of the plurality of duplexers 304 may include switching, coupling, and/or filtering circuitry configured to direct RF signals to/from the respective receive (RX) and transmit (TX) paths. In some examples, the ASM 302 can be operated or controlled in different modes of operation to connect each of the plurality of duplexers 304 to the antenna 312 (via the antenna terminal 310). For example, in a first mode of operation, the ASM 302 can be controlled to connect the first duplexer 304a to the antenna 312 by coupling the first T/R terminal 308a to the antenna terminal 310. Similarly, in a second mode of operation, the ASM 302 can be controlled to connect the second duplexer 304b to the antenna 312 by coupling the second T/R terminal 308b to the antenna terminal 310 and, in a third mode of operation, the ASM 302 can be controlled to connect the third duplexer 304c to the antenna 312 by coupling the third T/R terminal 308c to the antenna terminal 310.

In some examples, each duplexer of the plurality of duplexers 304 corresponds to a specific frequency or frequency band. For example, the first duplexer 304a and the receive (RX) and transmit (TX) paths coupled to the first duplexer 304a may correspond to a first frequency or frequency band. As such, the ASM 302 can be controlled to operate in the first mode of operation when transmitting/receiving RF signals corresponding to the first frequency (or frequency band). Similarly, the second duplexer 304b and the receive (RX) and transmit (TX) paths coupled to the second duplexer 304b may correspond to a second frequency (or frequency band) and the ASM 302 can be controlled to operate in the second mode of operation when transmitting/receiving RF signals corresponding to the second frequency (or frequency band). Likewise, the third duplexer 304c and the receive (RX) and transmit (TX) paths coupled to the third duplexer 304c may correspond to a third frequency (or frequency band) and the ASM 302 can be controlled to operate in the third mode of operation when transmitting/receiving RF signals corresponding to the third frequency (or frequency band).

In order to provide optimal performance (e.g., low loss) at each frequency (or band), the resonant frequency of each duplexer (and the respective RX, TX paths) can be tuned or adjusted via impedance matching. As described above, the shunt inductor 306 is coupled to the antenna terminal 310 and provides at least a partial impedance match during each mode of operation. In one example, a plurality of phase/impedance rotation elements 314 are coupled to the plurality of duplexers 304 and contribute, in conjunction with the shunt inductor 306, to the impedance match during each mode of operation. For example, the first phase/impedance rotation element 314a is coupled to the first duplexer 304a and configured to adjust the impedance of the first duplexer 304a and the receive (RX) and transmit (TX) paths coupled to the first duplexer 304a by a first amount such that the partial match provided by the shunt inductor 306 provides a resonant frequency at the first frequency (or frequency band) during the first mode of operation. In one example, the impedance adjustment provided by the first phase/impedance rotation element 314a corresponds to a first phase/impedance rotation ($\Phi_1$). Likewise, the second phase/impedance rotation element 314b is coupled to the second duplexer 304b and configured to adjust the impedance of the second duplexer 304b and the receive (RX) and transmit (TX) paths coupled to the second duplexer 304b by a second amount such that the partial match provided by the shunt inductor 306 provides a resonant frequency at the second frequency (or frequency band) during the second mode of operation. In one example, the impedance adjustment provided by the second phase/impedance rotation element 314b corresponds to a second phase/impedance rotation ($\Phi_2$). Similarly, the third phase/impedance rotation element 314c is coupled to the third duplexer 304c and configured to adjust the impedance of the third duplexer 304c and the receive (RX) and transmit (TX) paths coupled to the third duplexer 304c by a third amount such that the partial match provided by the shunt inductor 306 provides a resonant frequency at the third frequency (or frequency band) during the third mode of operation. In one example, the impedance adjustment provided by the third phase/impedance rotation element 314c corresponds to a third phase/impedance rotation ($\Phi_3$).

In some examples, each of the plurality of phase/impedance rotation elements 314 is a passive component, such as a capacitor and/or an inductor, configured to provide a reactance to offset and/or augment an inductive reactance associated with the shunt inductor 306. In certain examples, each of the plurality of phase/impedance rotation elements 314 may be a capacitor configured to provide a capacitive reactance offsetting the inductive reactance of the shunt inductor 306. To provide the desired resonant frequency during each mode of operation, the value of each capacitor may be selected to provide an offsetting reactance at the frequency (or frequency band) corresponding to the mode of operation (i.e., the first frequency, second frequency, etc.).

In certain examples, the parasitic capacitance of each duplexer and the receive (RX) and transmit (TX) paths coupled to each duplexer may be taken into consideration when selecting the value of each capacitor (i.e., the plurality of phase/impedance rotation elements 314). For example, the parasitic capacitance of the first duplexer 304*a*, the parasitic capacitance of the receive (RX) and transmit (TX) paths coupled to the first duplexer 304*a*, and the capacitance of the first phase/impedance rotation element 314*a* may combine to provide the offsetting reactance at the first frequency. Likewise, the parasitic capacitance of the second duplexer 304*b*, the parasitic capacitance of the receive (RX) and transmit (TX) paths coupled to the second duplexer 304*b*, and the capacitance of the second phase/impedance rotation element 314*b* may combine to provide the offsetting reactance at the second frequency, and so on. In some examples, the contributions of the parasitic capacitances may enable the phase/impedance rotation elements to have relatively small values (and package sizes).

In one example, the plurality of phase/impedance rotation elements 314 may each be substantially smaller in size relative to the shunt inductor 306. For example, each phase/impedance rotation element (i.e., capacitor) may have a package size of approximately 50 by 50 microns and the shunt inductor 306 may have a package size of approximately 400 by 200 microns. As such, by utilizing a common inductor (i.e., the shunt inductor 306), the footprint of the ASM arrangement 300 can be reduced relative to the footprint of the ASM arrangement 200 of FIG. 2. In some examples, the reduced footprint of the ASM arrangement 300 may enable the footprint (or package size) of the FEM to be reduced by 5% or more.

In certain examples, the electrical traces or transmission lines connecting the plurality of duplexers 304 to the ASM 302 can be configured to contribute to the tuning of the resonant frequency. In one example, the electrical traces (e.g., MCM embedded traces) can be configured to provide a capacitive or inductive reactance that contributes to the tuning of the resonant frequency. In other words, the electrical traces may be configured to provide a reactance that partially offsets the inductive reactance of the shunt inductor 306, or in some cases, adds to the inductive reactance of the shunt inductor 306. For example, the first phase/impedance rotation element 314*a* and the first electrical trace 316*a* may provide a combined adjustment of the impedance of the first duplexer 304*a* and the receive (RX) and transmit (TX) paths coupled to the first duplexer 304*a* such that the partial match provided by the shunt inductor 306 provides a resonant frequency at the first frequency (or frequency band). Likewise, the second phase/impedance rotation element 314*b* and the second electrical trace 316*b* may provide a combined adjustment of the impedance of the second duplexer 304*b* and the receive (RX) and transmit (TX) paths coupled to the second duplexer 304*b* such that the partial match provided by the shunt inductor 306 provides a resonant frequency at the second frequency (or frequency band). In some examples, the impedance match contribution of the electrical traces may allow the values of the plurality of phase/impedance rotation elements 314 to be reduced, and in some cases, may allow for the use of even smaller package sizes for the plurality of phase/impedance rotation elements 314. As such, the footprint of the ASM arrangement 300 (and the FEM) may be reduced further.

As described above, the ASM arrangement 300 includes a single shunt inductor and one dedicated phase/impedance rotation element per duplexer. However, it should be appreciated that ASM arrangements incorporating a single shunt inductor may be configured differently.

Figure 4:
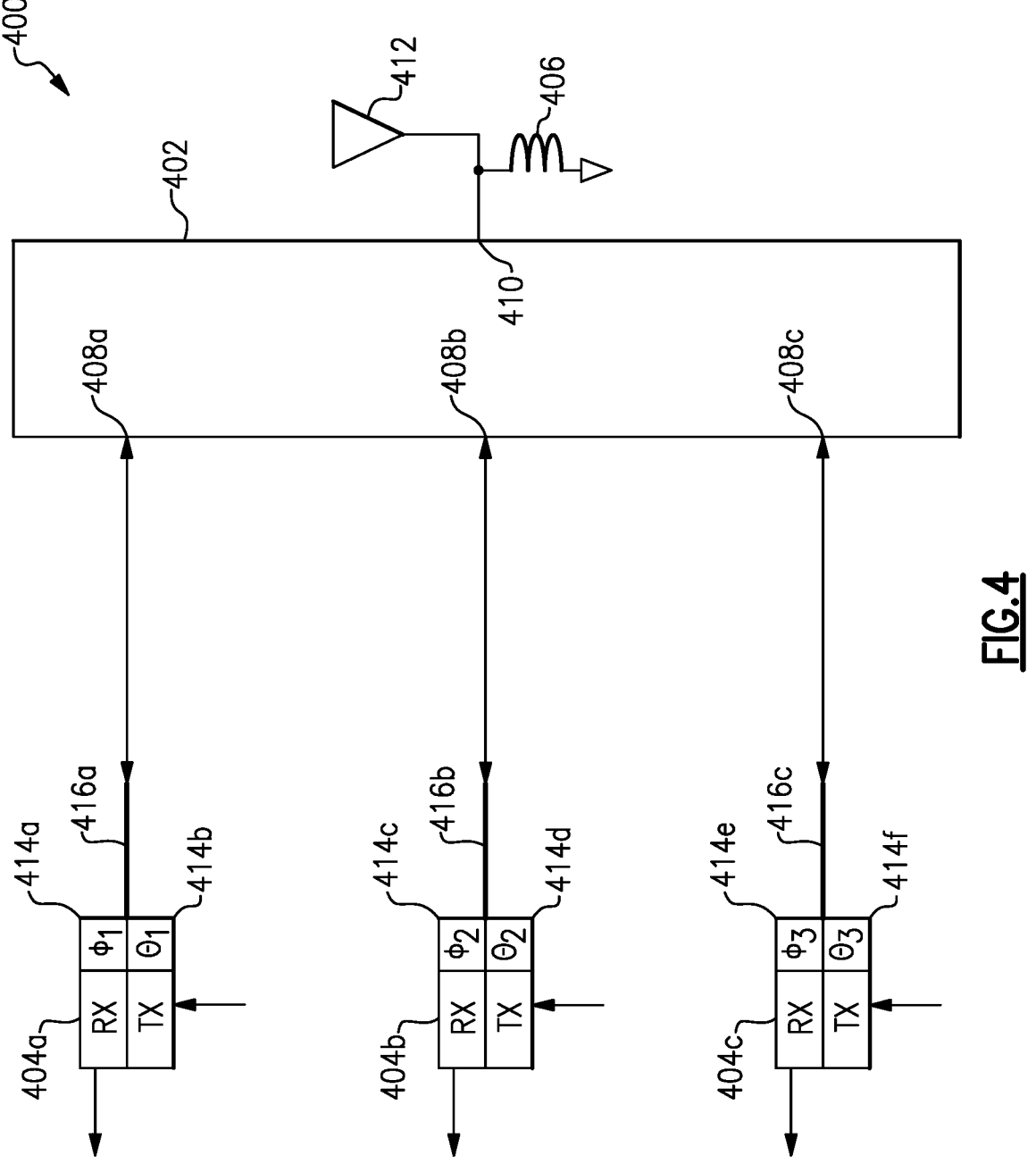
FIG. 4 is a block diagram of an antenna switching module arrangement in accordance with aspects described herein.

For example, FIG. 4 is a schematic diagram of an ASM arrangement 400 in accordance with aspects described herein. In one example, the ASM arrangement 400 may be included in a FEM (e.g., the FEM 100 of FIG. 1). The ASM arrangement 400 includes an ASM 402, a plurality of duplexers 404, and a single shunt inductor 406. As shown, a plurality of T/R terminals 408 includes a first T/R terminal 408*a*, a second T/R terminal 408*b*, and a third T/R terminal 408*c*; however, in other examples, the ASM 402 may include a different number of T/R terminals. The first T/R terminal 408*a* is coupled to the first duplexer 404*a*, the second T/R terminal 408*b* is coupled to the second duplexer 404*b*, and the third T/R terminal 408*c* is coupled to the third duplexer 404*c*. In some examples, the ASM 402 includes an antenna terminal 410 coupled to an antenna 412. As shown, the shunt inductor 406 is coupled to the antenna terminal 410.

In one example, each of the plurality of duplexers 404 is coupled to a pair of receive (RX) and transmit (TX) paths. Each duplexer of the plurality of duplexers 404 may include switching, coupling, and/or filtering circuitry configured to direct RF signals to/from the respective receive (RX) and transmit (TX) paths. In some examples, the ASM 402 can be operated or controlled in different modes of operation to connect each of the plurality of duplexers 404 to the antenna 412 (via the antenna terminal 410). For example, in a first mode of operation, the ASM 402 can be controlled to connect the first duplexer 404*a* to the antenna 412 by coupling the first T/R terminal 408*a* to the antenna terminal 410. Similarly, in a second mode of operation, the ASM 402 can be controlled to connect the second duplexer 404*b* to the antenna 412 by coupling the second T/R terminal 408*b* to the antenna terminal 410 and, in a third mode of operation, the ASM 402 can be controlled to connect the third duplexer 404*c* to the antenna 412 by coupling the third T/R terminal 408*c* to the antenna terminal 410.

In some examples, each duplexer of the plurality of duplexers 404 corresponds to a pair of receive and transmit frequencies (or frequency bands). For example, the receive (RX) portion of the first duplexer 404*a* and the receive (RX) path coupled to the first duplexer 404*a* may correspond to a first receive frequency (or band). Likewise, the transmit (TX) portion of the first duplexer 404*a* and the transmit (TX) path coupled to the first duplexer 404*a* may correspond to a first transmit frequency (or frequency band). As such, the ASM 402 can be controlled to operate in the first mode of operation when transmitting/receiving RF signals corresponding to the first pair of receive and transmit frequencies (or frequency bands). In certain examples, the first receive and transmit frequencies may be different, but related to one another (e.g., uplink/downlink frequencies, different channels, etc.). Similarly, the receive (RX) portion of the second duplexer 404*b* and the receive (RX) path coupled to the second duplexer 404*b* may correspond to a second receive frequency (or frequency band). Likewise, the transmit (TX) portion of the second duplexer 404*b* and the transmit (TX) path coupled to the second duplexer 404*b* may correspond to a second transmit frequency (or band). As such, the ASM 402 can be controlled to operate in the second mode of operation when transmitting/receiving RF signals corresponding to the second pair of receive and transmit frequencies (or frequency bands). In some examples, the third duplexer 404c is configured similarly, and the ASM 402 can be controlled to operate in the third mode of operation when transmitting/receiving RF signals corresponding to a third pair of receive and transmit frequencies (or frequency bands).

In order to provide optimal performance (e.g., low loss) at each frequency (or frequency band), the resonant frequency of each duplexer (and the respective RX, TX paths) can be tuned or adjusted via impedance matching. As described above, the shunt inductor 406 is coupled to the antenna terminal 410 and provides at least a partial impedance match during each mode of operation. In one example, a plurality of phase/impedance rotation elements 414 are coupled to the plurality of duplexers 404 and contribute, in conjunction with the shunt inductor 406, to the impedance match during each mode of operation. For example, the first phase/impedance rotation element 414a is coupled to the receive (RX) portion of the first duplexer 404a and configured to adjust the impedance of the receive (RX) portion of the first duplexer 404a and the receive (RX) path coupled to the first duplexer 404a. The first phase/impedance rotation element 414a is configured to adjust the impedance by a first amount such that the partial match provided by the shunt inductor 406 provides a resonant frequency at the first receive frequency (or frequency band). In one example, the impedance adjustment provided by the first phase/impedance rotation element 414a corresponds to a first phase/impedance rotation ($\Phi_1$). Likewise, the second phase/impedance rotation element 414b is coupled to the transmit (TX) portion of the first duplexer 404a and configured to adjust the impedance of the transmit (TX) portion of the first duplexer 404a and the receive (TX) path coupled to the first duplexer 404a. The second phase/impedance rotation element 414b is configured to adjust the impedance by a second amount such that the partial match provided by the shunt inductor 406 provides a resonant frequency at the first transmit frequency (or frequency band). In one example, the impedance adjustment provided by the second phase/impedance rotation element 414b corresponds to a second phase/impedance rotation ($\theta_1$).

Similarly, the third phase/impedance rotation element 414c is coupled to the receive (RX) portion of the second duplexer 404b and the fourth phase/impedance rotation element 414d is coupled to the transmit (TX) portion of second duplexer 404b. Similar to the first and second phase/impedance rotation elements 414a, 414b, the fifth and sixth phase/impedance rotation elements 414e, 414f are configured to provide impedance adjustments for the second receive and transmit frequencies. In one example, the impedance adjustment provided by the third phase/impedance rotation element 414c corresponds to a third phase/impedance rotation ($\Phi_2$) and the impedance adjustment provided by the fourth phase/impedance rotation element 414d corresponds to a fourth phase/impedance rotation ($\theta_2$). Likewise, the fifth phase/impedance rotation element 414e is coupled to the receive (RX) portion of the third duplexer 404c and the sixth phase/impedance rotation element 414f is coupled to the transmit (TX) portion of third duplexer 404c. Similar to the other phase/impedance rotation elements, the fifth and sixth phase/impedance rotation elements 414e, 414f are configured to provide impedance adjustments for the third receive and transmit frequencies. In one example, the impedance adjustment provided by the fifth phase/impedance rotation element 414e corresponds to a fifth phase/impedance rotation ($\Phi_3$) and the impedance adjustment provided by the sixth phase/impedance rotation element 414f corresponds to a sixth phase/impedance rotation ($\theta_3$).

In some examples, each of the plurality of phase/impedance rotation elements 414 is a passive component configured to provide a reactance to offset an inductive reactance associated with the shunt inductor 406. In certain examples, each of the plurality of phase/impedance rotation elements 414 may be a capacitor configured to provide a capacitive reactance offsetting the inductive reactance of the shunt inductor 406. To provide the desired resonant frequency or frequencies during each mode of operation, the value of each capacitor may be selected to provide an offsetting reactance at the frequency or frequencies corresponding to the mode of operation (i.e., the first receive frequency, first transmit frequency, second receive frequency etc.).

In certain examples, the parasitic capacitance of each duplexer and the receive (RX) and transmit (TX) paths coupled to each duplexer may be taken into consideration when selecting the value of each capacitor (i.e., the plurality of phase/impedance rotation elements 414). For example, the parasitic capacitance of the first duplexer 404a, the parasitic capacitance of the receive (RX) path coupled to the first duplexer 404a, and the capacitance of the first phase/impedance rotation element 414a may combine to provide the offsetting reactance at the first receive frequency. Likewise, the parasitic capacitance of the first duplexer 404a, the parasitic capacitance of the transmit (TX) path coupled to the first duplexer 404a, and the capacitance of the second phase/impedance rotation element 414b may combine to provide the offsetting reactance at the first transmit frequency, and so on. In some examples, the contributions of the parasitic capacitances may enable the phase/impedance rotation elements to have relatively small values (and package sizes).

As described above, the plurality of phase/impedance rotation elements 414 may each be substantially smaller in size relative to the shunt inductor 406. As such, by utilizing a common inductor (i.e., the shunt inductor 406), the footprint of the ASM arrangement 400 can be reduced relative to the footprint of the ASM arrangement 200 of FIG. 2. In some examples, the reduced footprint of the ASM arrangement 400 may enable the footprint (or package size) of the FEM to be reduced.

In certain examples, the electrical traces or transmission lines connecting the plurality of duplexers 404 to the ASM 402 can be configured to contribute to the tuning of the resonant frequency. In one example, the electrical traces (e.g., MCM embedded traces) can be configured to provide a capacitive or inductive reactance that contributes to the tuning of the resonant frequency. In other words, the electrical traces may be configured to provide a reactance that partially offsets the inductive reactance of the shunt inductor 406, or in some cases, adds to the inductive reactance of the shunt inductor 406. For example, the first phase/impedance rotation element 414a and the first electrical trace 416a may provide a combined adjustment of the impedance of the receive (RX) portion of the first duplexer 404a and the receive (RX) path coupled to the first duplexer 404a such that the partial match provided by the shunt inductor 406 provides a resonant frequency at the first receive frequency (or frequency band). Likewise, the second phase/impedance rotation element 414b and the first electrical trace 416a may provide a combined adjustment of the impedance of the transmit (TX) portion of the first duplexer 404a and the transmit (TX) path coupled to the first duplexer 404a such that the partial match provided by the shunt inductor 406 provides a resonant frequency at the first transmit frequency (or frequency band). In one example, the second electrical trace 416b coupled to the second duplexer 404b and the third electrical trace 416c coupled to the third duplexer 404c can be configured in a similar manner.

In some examples, the impedance match contribution of the electrical traces may allow the values of the plurality of phase/impedance rotation elements 414 to be reduced, and in some cases, may allow for the use of even smaller package sizes for the plurality of phase/impedance rotation elements 414. As such, the footprint of the ASM arrangement 400 (and the FEM) may be reduced further.

Figure 5:
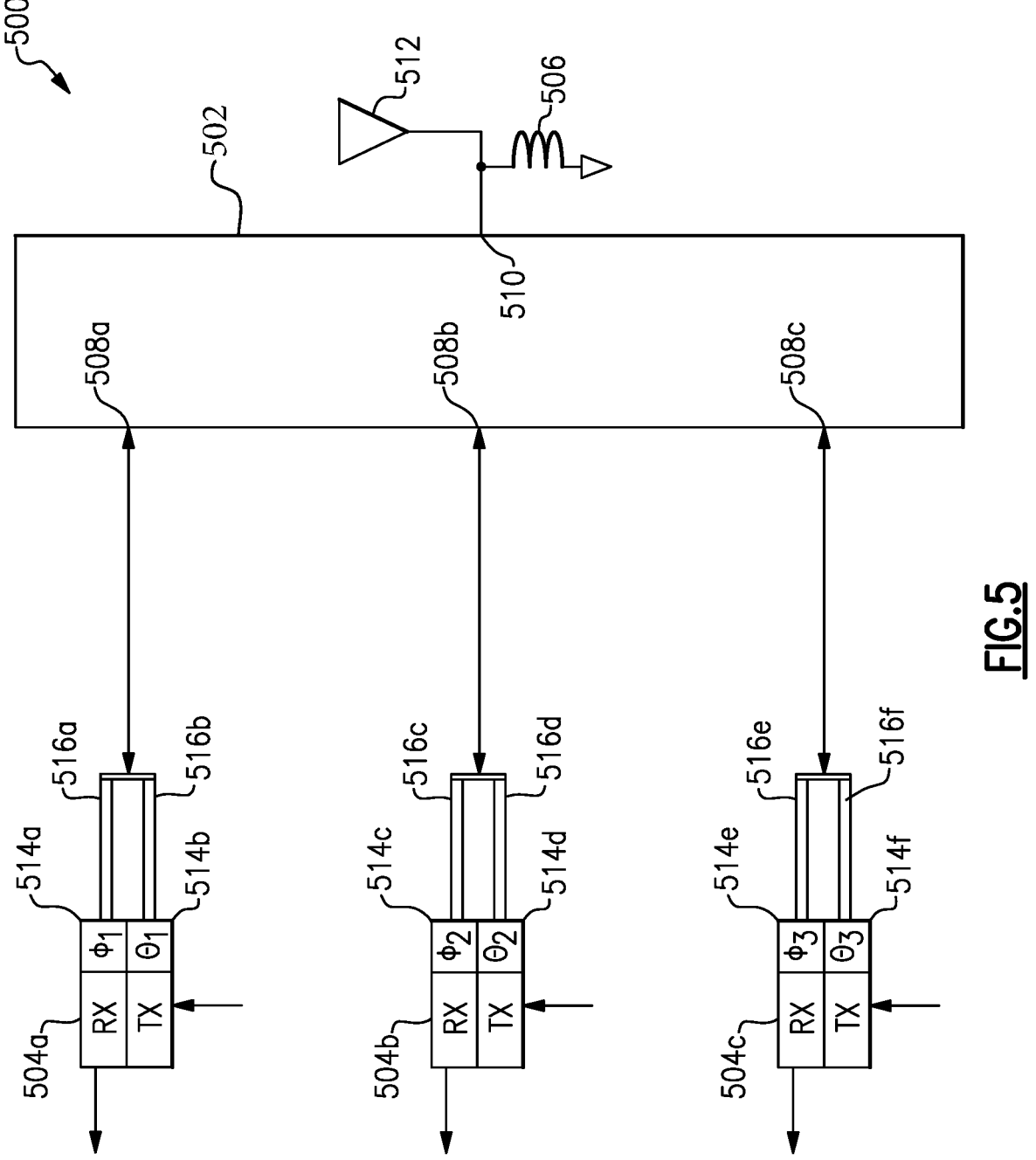
FIG. 5 is a block diagram of an antenna switching module arrangement in accordance with aspects described herein.

FIG. 5 is a schematic diagram of an ASM arrangement 500 in accordance with aspects described herein. As shown, the ASM arrangement 500 includes an ASM 502, a plurality of duplexers 504, and a single shunt inductor 506. In one example, the ASM arrangement 500 is substantially the same as the ASM arrangement 400 of FIG. 4, except the ASM arrangement 500 includes separate electrical traces for the receive (RX) and transmit (TX) portions of each duplexer.

As with other aspects described herein, in some examples the ASM 502 includes an antenna terminal 510 coupled to an antenna 512. In some examples the ASM 502 may also include a number of T/R terminals, for example, T/R terminals 508a, 508b, and 508c. The purpose and functionality of these parts may be substantially similar to their purpose and functionality in other examples described herein.

As described above, the electrical traces or transmission lines connecting the plurality of duplexers 504 to the ASM 502 can be configured to contribute to the tuning of the resonant frequency. In one example, the electrical traces (e.g., MCM embedded traces) can be configured to provide a capacitive or inductive reactance that contributes to the tuning of the resonant frequency. In other words, the electrical traces may be configured to provide a reactance that partially offsets the inductive reactance of the shunt inductor 506, or in some cases, adds to the inductive reactance of the shunt inductor 506. For example, the first phase/impedance rotation element 514a and the first electrical trace 516a may provide a combined adjustment of the impedance of the receive (RX) portion of the first duplexer 504a and the receive (RX) path coupled to the first duplexer 504a such that the partial match provided by the shunt inductor 506 provides a resonant frequency at the first receive frequency (or frequency band). Likewise, the second phase/impedance rotation element 514b and the second electrical trace 516b may provide a combined adjustment of the impedance of the transmit (TX) portion of the first duplexer 504a and the transmit (TX) path coupled to the first duplexer 504a such that the partial match provided by the shunt inductor 506 provides a resonant frequency at the first transmit frequency (or frequency band). In one example, the third and fourth electrical traces 516c, 516d coupled to the second duplexer 504b and the fifth and sixth electrical traces 516e, 516f coupled to the third duplexer 504c can be configured in a similar manner.

In some examples, different combinations of the techniques illustrated in FIGS. 3-5 may be used in a single ASM arrangement. For example, an ASM arrangement may include one or more T/R terminals coupled to a duplexer with the phase/impedance rotation element configuration of FIG. 3, one or more T/R terminals coupled to a duplexer with the phase/impedance rotation element configuration of FIG. 4, and/or one or more T/R terminals coupled to a duplexer with the phase/impedance rotation element configuration of FIG. 5.

While the shunt inductors 306, 406, and 506 are each described as single inductors, it should be appreciated that multiple parallel inductors may be used in place of the single shunt inductors. For example, two inductors may be coupled in parallel to provide a desired quality factor (i.e., Q factor) and to reduce variations due to fabrication/production tolerances. Likewise, each phase/impedance rotation element of the pluralities of phase/impedance rotation elements 314, 414, and 514 may include multiple components (e.g., capacitors) and switching circuitry to support additional frequencies and/or modes of operation. In some examples, the phase/impedance rotation elements can include adjustable components (e.g., varactors) to support additional frequencies and/or modes of operation.

Embodiments of the ASM arrangements 300, 400, and 500 and/or FEMs including the ASM arrangements 300, 400, and 500 described herein may be advantageously used in a variety of electronic devices. Examples of the electronic devices can include, but are not limited to, consumer electronic products, parts of consumer electronic products, electronic test equipment, cellular communications infrastructure such as a base station, etc. Examples of the electronic devices can include, but are not limited to, a router, a gateway, a mobile phone such as a smart phone, a telephone, a television, a computer monitor, a computer, a modem, a hand-held computer, a laptop computer, a tablet computer, an electronic book reader, a wearable computer such as a smart watch, a personal digital assistant (PDA), an appliance, such as a microwave, refrigerator, or other appliance, an automobile, a stereo system, a DVD player, a CD player, a digital music player such as an MP3 player, a radio, a camcorder, a camera, a digital camera, a portable memory chip, a health-care-monitoring device, a vehicular electronics system such as an automotive electronics system or an avionics electronic system, a peripheral device, a wrist watch, a clock, etc. Further, the electronic devices can include unfinished products.

In addition, it should be appreciated that the ASM arrangements 300, 400, and 500 and/or FEMs including the ASM arrangements 300, 400, and 500 may be configured for use in wireless local area network (WLAN), ultra-wideband (UWB), wireless personal area network (WPAN), 4G cellular, LTE cellular, 5G cellular, applications. In some examples, the ASM arrangements 300, 400, and 500 and/or FEMs including the ASM arrangements 300, 400, and 500 may be configured for high-frequency applications (e.g., up to 6 GHz).

As such, an improved ASM arrangement is provided herein. In at least one embodiment, the ASM arrangement includes a single shunt inductor and is configured to support a plurality of frequencies (or frequency bands). In some examples, the ASM arrangement includes a plurality of phase/impedance rotation elements that combine in conjunction with the single shunt inductor to provide optimal performance at each of the plurality of frequencies (or frequency bands).

It is to be appreciated that example ASMs, ASM arrangements, and FEMs provided herein are provided for purposes of explanation. In some examples, certain ASMs, ASM arrangements, and FEMs may include additional, fewer, or different components than those illustrated. Certain ASMs, ASM arrangements, and FEMs may include additional components that have not been illustrated for purposes of clarity. For example, one or more of the ASM arrangements 300,

400, and 500, or the ASMs 302, 402, and 502, may include an interface configured according to the Mobile Industry Processor Interface (MIPI) standard and having one or more ports or pins, one or more voltage input or output ports or pins, one or more filters, one or more coupling elements, one or more coupler ports or pins, one or more resistors, inductors, and/or capacitors, one or more switches, and so forth.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A switching module assembly comprising:
   a switching module including a plurality of transmit/receive terminals and an antenna terminal;
   at least one shunt inductor coupled to the antenna terminal;
   a plurality of duplexers coupled to the plurality of transmit/receive terminals, each duplexer corresponding to a respective signal frequency of a plurality of different signal frequencies and including a receive portion and a transmit portion; and
   a plurality of phase/impedance rotation elements coupled to the plurality of duplexers and configured to adjust a phase/impedance of each duplexer in conjunction with the at least one shunt inductor to provide a resonant frequency at the respective signal frequency of each duplexer, the receive portion and the transmit portion of each duplexer of the plurality of duplexers being coupled to different phase/impedance rotation elements of the plurality of phase/impedance rotation elements.

2. The switching module assembly of claim 1 wherein the switching module is configured to selectively connect each transmit/receive terminal of the plurality of transmit/receive terminals to the antenna terminal.

3. The switching module assembly of claim 1 wherein the switching module is configured to receive radio frequency signals at each of the plurality of transmit/receive terminals and the antenna terminal.

4. The switching module assembly of claim 1 wherein the antenna terminal of the switching module is configured to be connected to an antenna.

5. The switching module assembly of claim 1 wherein each duplexer of the plurality of duplexers is configured to be coupled to a receive path and a transmit path.

6. The switching module assembly of claim 1 wherein each duplexer of the plurality of duplexers is coupled to a corresponding phase/impedance rotation element of the plurality of phase/impedance rotation elements.

7. The switching module assembly of claim 1 wherein each phase/impedance rotation element of the plurality of phase/impedance rotation elements is configured to provide a first portion of an impedance match and the at least one shunt inductor is configured to provide a second portion of the impedance match.

8. The switching module assembly of claim 1 wherein the plurality of duplexers are coupled to the plurality of transmit/receive terminals via a plurality of electrical traces.

9. The switching module assembly of claim 8 wherein each phase/impedance rotation element of the plurality of phase/impedance rotation elements is configured to provide a first portion of an impedance match, each electrical trace of the plurality of electrical traces is configured to provide a second portion of the impedance match, and the at least one shunt inductor is configured to provide a third portion of the impedance match.

10. The switching module assembly of claim 1 wherein each phase/impedance rotation element of the plurality of phase/impedance rotation elements includes at least one capacitor.

11. The switching module assembly of claim 10 wherein a capacitance the at least one capacitor is based on a parasitic capacitance of each duplexer of the plurality of duplexers.

12. The switching module assembly of claim 10 wherein the at least one capacitor has smaller dimensions than the at least one shunt inductor.

13. The switching module assembly of claim 1 wherein the switching module assembly is configured to be included in a front end module.

14. The switching module assembly of claim 1 wherein at least one phase/impedance rotation element of the plurality of phase/impedance rotation elements is configured to have an adjustable value.

15. A signal switching system comprising:
   a switching module assembly including a plurality of transmit/receive terminals and an antenna terminal;
   at least one shunt inductor coupled to the antenna terminal and configured to provide a first portion of an impedance match;
   a plurality of duplexers coupled to a plurality of transmit/receive terminals, each duplexer corresponding to a respective signal frequency of a plurality of different signal frequencies and including a receive portion and a transmit portion, and each duplexer including at least one phase/impedance rotation element of a plurality of phase/impedance rotation elements to provide a second portion of the impedance match, each duplexer being configured to selectively couple with the switching module assembly based on the impedance match;
   the plurality of phase/impedance rotation elements configured to adjust a phase/impedance of each duplexer in conjunction with the at least one shunt inductor to provide a resonant frequency at the respective signal frequency of each duplexer, the receive portion and the transmit portion of each duplexer of the plurality of duplexers being coupled to different phase/impedance rotation elements of the plurality of phase/impedance rotation elements; and
   a plurality of electrical traces, each respective electrical trace connecting a respective duplexer of the plurality of duplexers to a respective transmit/receive terminal of the plurality of transmit/receive terminals, each respective electrical trace providing a third portion of the impedance match.

16. The system of claim 15 wherein each duplexer of the plurality of duplexers is configured to be coupled to a transmit path and a receive path, and each duplexer has a transmit portion and a receive portion.

17. The system of claim 16 wherein each transmit portion of each duplexer of the plurality of duplexers is coupled to a respective phase/impedance rotation element, and each receive portion of each duplexer of the plurality of duplexers is coupled to a different respective phase/impedance rotation element.

18. The system of claim 17 wherein each respective phase/impedance rotation element is coupled to a respective electrical trace of the plurality of electrical traces.

* * * * *